(12) United States Patent
Mader, Sr. et al.

(10) Patent No.: US 10,634,520 B1
(45) Date of Patent: Apr. 28, 2020

(54) EXPANDABLE SWITCH SENSORS WITH EXPANDABLE MAGNETIC ACTUATORS

(71) Applicants: Philip Mader, Sr., Berlin, CT (US); Andrew DiVicino, Berlin, CT (US)

(72) Inventors: Philip Mader, Sr., Berlin, CT (US); Andrew DiVicino, Berlin, CT (US)

(73) Assignee: UPC LLC ( * ) Notice: Subject to any disclaimer, the term of this patent is extended or adjusted under 35 U.S.C. 154(b) by 192 days.

(21) Appl. No.: 15/975,647

(22) Filed: May 9, 2018

(51) Int. Cl.
G01B 7/14 (2006.01)
G01D 5/252 (2006.01)
H03K 17/95 (2006.01)

(52) U.S. Cl.
CPC ........ G01D 5/2525 (2013.01); H03K 17/9505 (2013.01)

(58) Field of Classification Search
CPC .......... G01D 5/12; G01D 5/25; G01D 5/251; G01D 5/2515; G01D 5/2525
See application file for complete search history.

(56) References Cited

U.S. PATENT DOCUMENTS

| 4,053,355 | A | * | 10/1977 | Vuckovich | G01D 5/2515 376/258 |
| 5,333,160 | A | * | 7/1994 | Runde | G21C 17/12 376/258 |
| 6,380,734 | B1 | * | 4/2002 | Chari | G01B 7/003 322/31 |
| 7,791,506 | B2 | * | 9/2010 | Riihimaki | G06F 3/0202 200/19.36 |
| 8,442,180 | B2 | * | 5/2013 | Nakamura | G21C 7/08 376/258 |
| 2004/0174161 | A1 | | 9/2004 | Tausch et al. | |
| 2010/0141243 | A1 | | 6/2010 | Divicino et al. | |
| 2017/0254669 | A1 | * | 9/2017 | Franke | G01D 5/145 |

* cited by examiner

Primary Examiner — Thang X Le
(74) Attorney, Agent, or Firm — Quickpatents, LLC; Kevin Prince

(57) ABSTRACT

A modular sensing system for determining the relative lineal position between a first object and a second object includes an array of switch units fixed with the first object and an array of magnet units fixed with the second object. Each switch unit contains an electric circuit that includes a switch, a resistor, and conductors arranged to convey electricity from one of a pair of front connectors to one of a pair of rear connectors, and from the other front connector to the other rear connector through either the resistor or the switch when the switch is closed. The switch is normally open but closed when proximate one of the magnet units, each of which houses a magnet. Resistance between a pair of wires of a first switch unit in the array is related to the relative linear position between the arrays of switch units and magnet units.

15 Claims, 10 Drawing Sheets

EXPANDABLE SWITCH SENSORS WITH EXPANDABLE MAGNETIC ACTUATORS

CROSS-REFERENCE TO RELATED APPLICATIONS

Not Applicable.

STATEMENT REGARDING FEDERALLY SPONSORED RESEARCH AND DEVELOPMENT

Not Applicable.

FIELD OF THE INVENTION

This invention relates to sensors, and more particularly to a stackable sensor array.

DISCUSSION OF RELATED ART

There are numerous applications in which the position of a first object, relative to a second object, is to be determined. The determination is desirably (or, in certain instances, necessarily) made by generating and measuring a position-dependent electrical signal.

One application for such a system that has received considerable attention in the art concerns the positioning of a movable sash in a fume hood. For example, U.S. Pat. No. 4,706,553 describes a controller system in which sash position is monitored by a transducer to provide a signal that is indicative of the area of a fume hood opening. U.S. Pat. No. 4,893,551 discloses an apparatus for sensing the extent to which a fume hood opening is uncovered by the sashes, utilizing detectors to sense radiation from an optical or magnetic emitter. U.S. Pat. No. 6,994,619 provides a sash-sensing system for controlling the flow of air into a fume hood, utilizing an optical sensing device and a reflective tape. U.S. Pat. No. 5,333,160 teaches a control rod position transmitter for determining position of a control rod within a nuclear reactor. U.S. Pat. Pub. No. 2004/0174161 teaches a position sensing system for determining the position of an elevator within an elevator shaft. Our previous U.S. Pat. Pub. No. 2010/1041243 teaches a resistive position-sensing system that worked well but had certain drawbacks, such as being potentially incorrectly assembled in the field, and not requiring alternatingly inverting units for both generating a uniform magnetic field pattern in a magnet unit array and for simplifying switch unit construction.

Consequently, there is still a need for a position-sensing system for use between two relatively movable objects that can be quickly assembled in the field from inexpensive yet durable and reliable segments or units. Such a system would be nearly impossible to assemble incorrectly, ensuring reliability after installation. Such a needed invention would provide excellent resolution even at relatively long operating lengths. The present invention accomplishes these objectives.

SUMMARY OF THE INVENTION

The present device is a modular sensing system for determining the relative lineal position between a first object and a second object, such as a window and a window frame, or a chemical hood door and door frame, for example.

An array of switch units is fixed with the first object. Each switch unit comprises an enclosure that has a top side, a bottom side, a front edge, and a rear edge. The front edge includes two front connectors, and the rear edge includes two rear connectors. The rear connectors are adapted for receiving the front connectors of an adjacent switch unit only when the adjacent switch unit is inverted. Each enclosure has an interior space between the top side and the bottom side.

The interior space contains an electric circuit therein that includes at least a switch, a resistor, and conductors arranged to convey electricity from one of the front connectors to one of the rear connectors, and from the other front connector to the other rear connector through either the resistor or the switch when the switch is closed. The switch is normally open but closed when proximate a sufficiently strong magnetic field. The enclosure is preferably made with a non-conductive polymer material.

A designated first switch unit is identical to the switch unit except that the front edge terminates with a pair of conductive wires, does not include the front connectors, and is therefore not adapted for insertion into the rear connectors of another switch unit. The first switch unit is positioned at a proximal end of the array of switch units. A designated last switch unit is identical to the switch unit except that the rear edge does not include the rear connectors and is therefore not adapted for receiving the front connectors of another switch unit. The last switch unit is positioned at a distal end of the array of switch units. Within the last switch unit the front connectors are electrically mutually connected.

An array of magnet units is fixed with the second object proximate to the array of switch units. Each magnet unit includes an enclosure having a top side, a bottom side, a front edge, and a rear edge. The front edge includes a first part of a two-part mechanical connector, and the rear edge includes a cooperative second part of the two-part mechanical connector. As such, two adjacent magnet units may be mechanically mutually coupled, each magnet unit having an interior space between the top side and the bottom side containing a magnet therein.

Preferably the first part of the two-part mechanical connector includes at least one tab, and the second part of the two-part mechanical connector includes at least one cooperative slot, such that the magnet units are mechanically coupled by pressing the at least one tab into one of the at least one cooperative slots. Contrasting with the switch units, preferably the two-part mechanical connector of the magnet units are indexed or keyed so that adjacent magnet units must be oriented similarly in order to be inserted into the next magnet unit and to maintain coplanar top sides and bottom sides in the array of magnet units. This also ensures that the magnetic fields produced by the magnet units create consistently strong common magnetic force fields along the array at each magnet unit. Further, the at least one tab of each enclosure of each magnet unit is sized to prevent its inadvertent insertion into a switch unit.

In use, in a first configuration of the two objects, the switch of each switch unit is in proximity to the magnetic field generated by the magnet of one of the magnet units, with each switch closed and the resistance between the pair of conductive wires of the first switch unit being a minimum resistance. In a second configuration of the two objects, a minimum number of the switches of each switch unit are in proximity to the magnetic field generated by the magnets of the magnet units, resulting in a maximum resistance between the pair of conductive wires of the first switch. Relative positions of the two objects between the first configuration and the second configuration result in an associated resistance between the minimum resistance and the maximum resistance.

The electric circuit of each switch unit includes a circuit board, and preferably the last switch unit includes an identical circuit board but further includes a conductive jumper electrically connected between two conductive shunt pads. In such an embodiment, one of the shunt pads is connected with the one front connector and the other shunt pad is connected to the other front connector through either the resistor or the switch when the switch is closed.

The present invention is a relative position-sensing system that can be quickly assembled in the field from relatively inexpensive yet durable and reliable segments or units.

Shared components and keyed enclosures/connectors ensure proper assembly in the field. The present system has afforded excellent resolution even at relatively long operating lengths. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Figure 1:
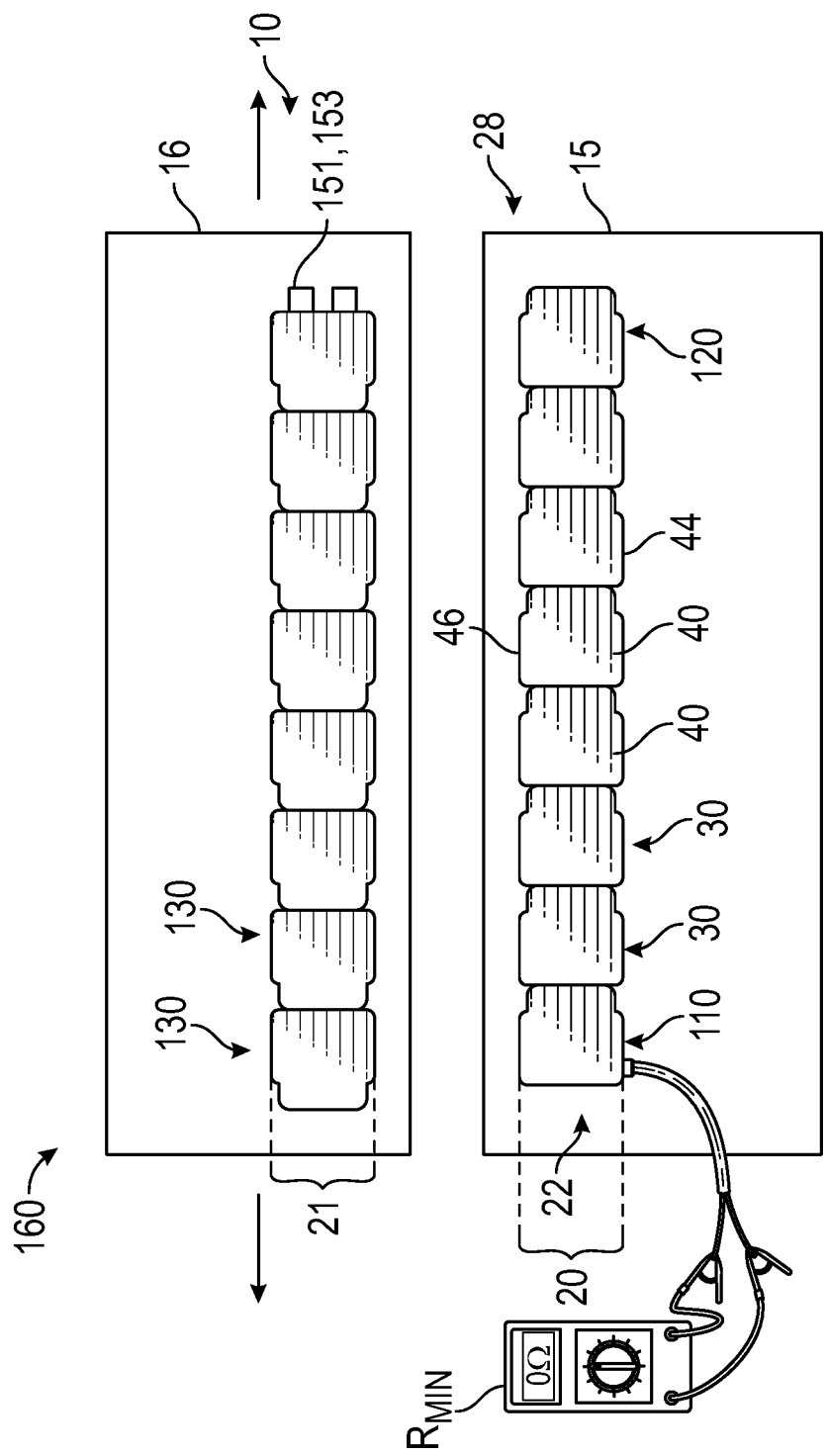
FIG. 1 is a diagram of the invention, showing a first and second object in close proximity resulting in a minimal resistance in an array of switch units of the invention.
Figure 2:
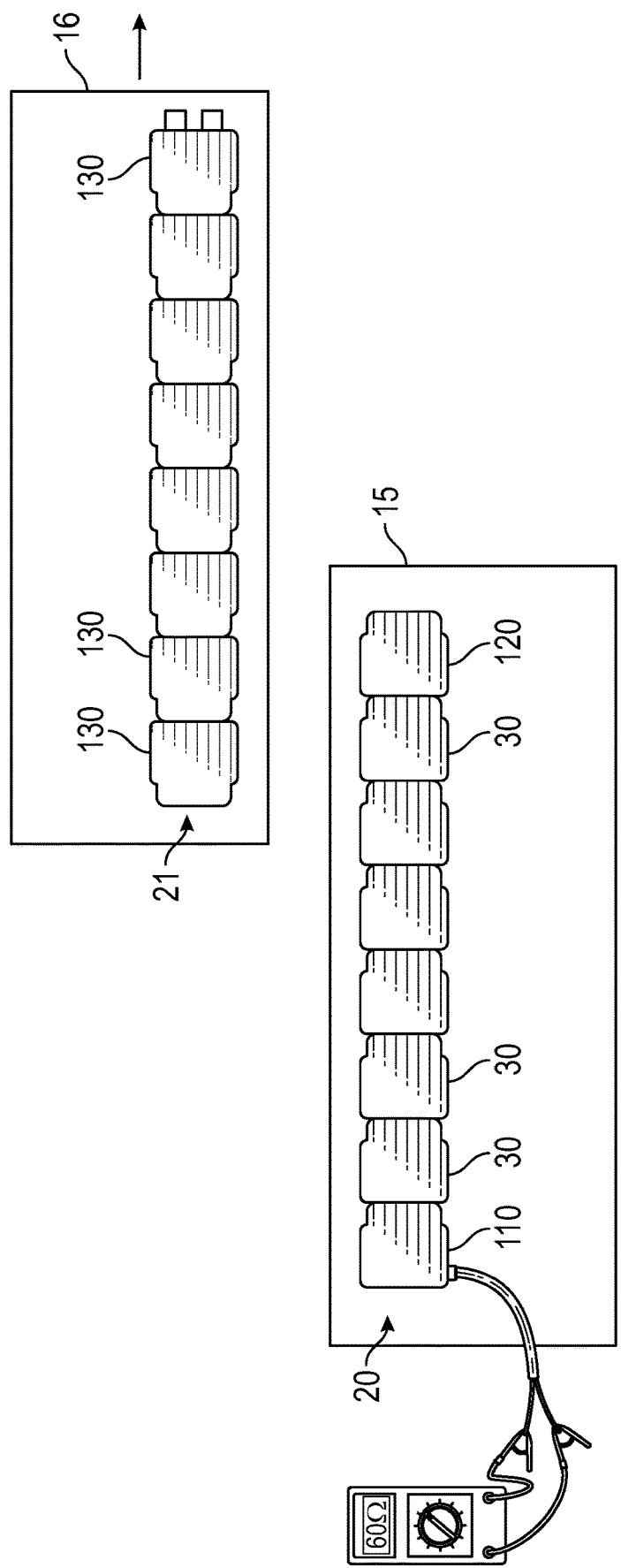
FIG. 2 is a diagram of the invention, showing the first and second objects of FIG. 1 becoming moving away from each other.
Figure 3:
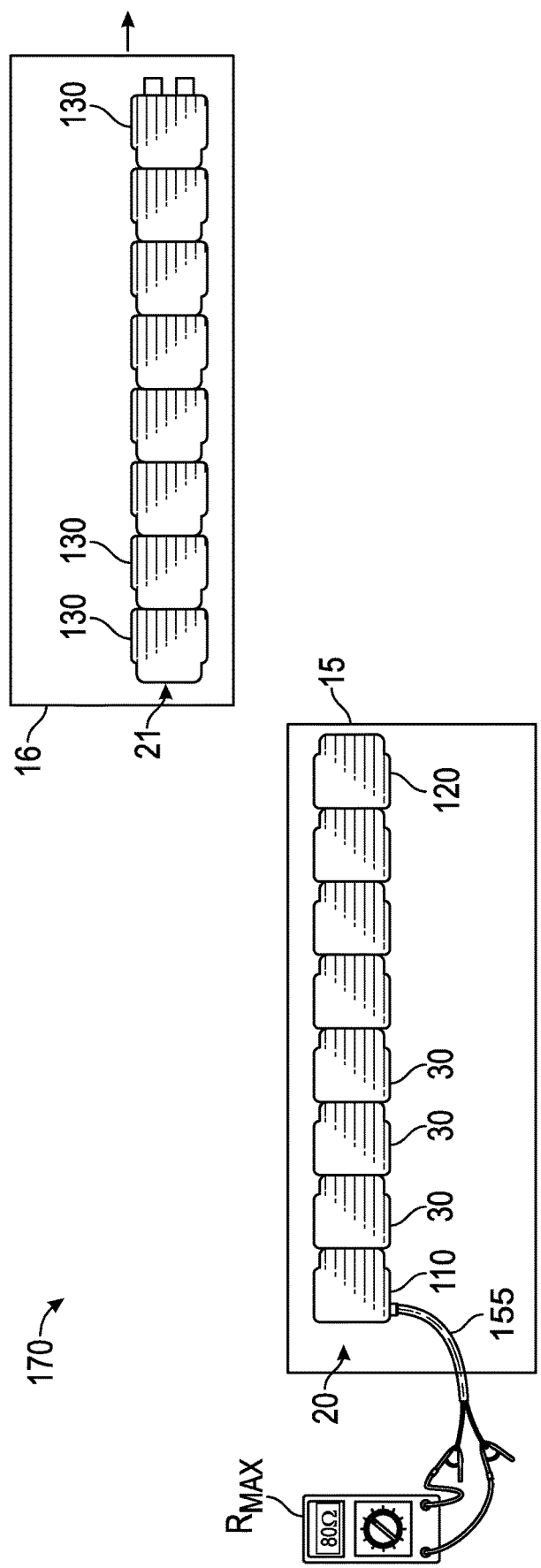
FIG. 3 is a diagram of the invention, showing the first and second objects of FIG. 1 apart from each other, resulting in a maximum resistance of the array of switch units of the invention.

FIGS. 1-3 illustrate a modular sensing system 10 for determining the relative lineal position between a first object 15 and a second object 16, such as a window and a window frame, or a chemical hood door and door frame, for example.

Figure 4A:
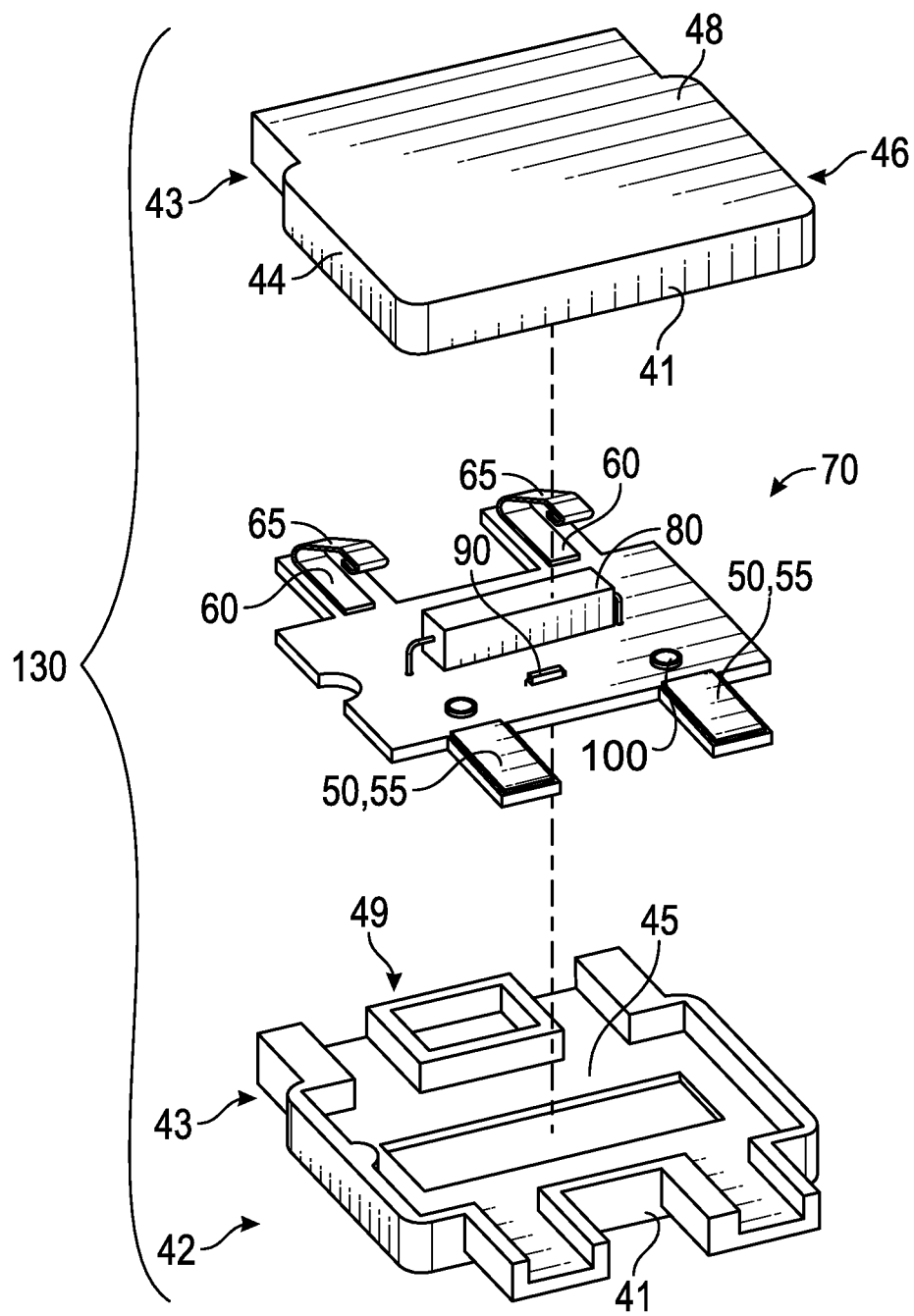
FIG. 4A is an exploded perspective view of one of the switch units of the invention.
Figure 4B:
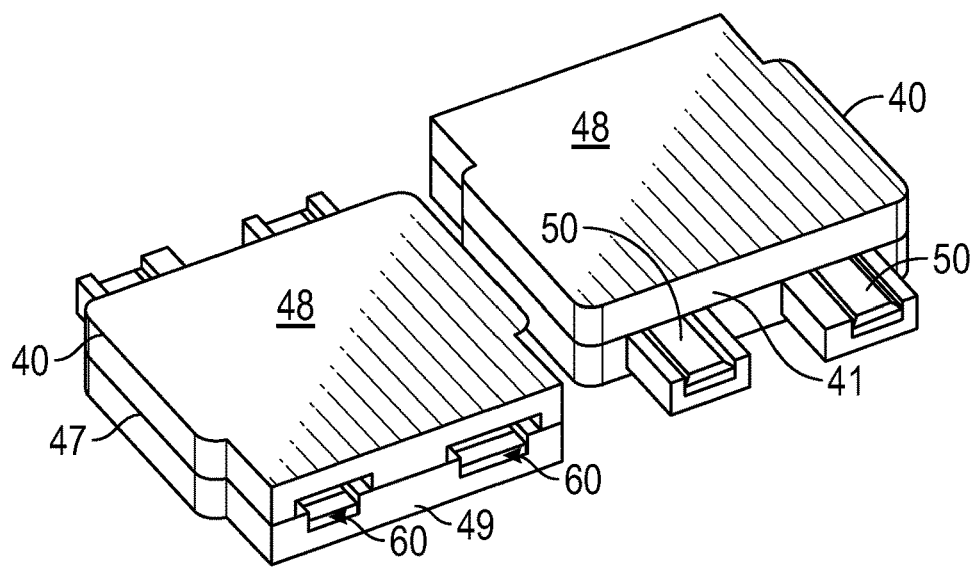
FIG. 4B is a perspective view of a pair of the switch units, showing a front side and a rear side thereof.
Figure 8:
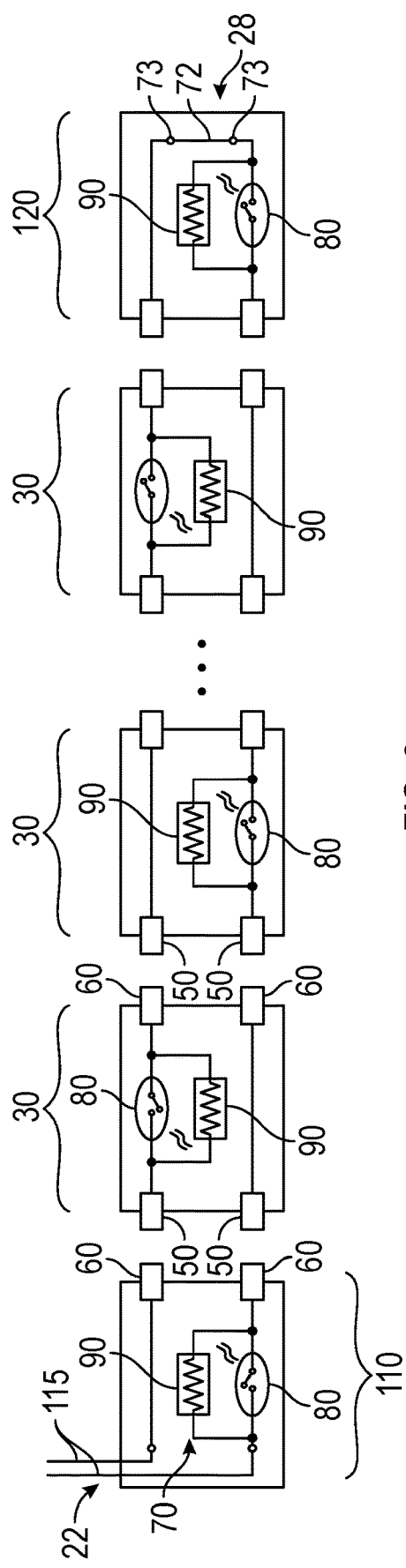
FIG. 8 is a schematic diagram of the array of switch units.

An array 20 of switch units 30 is fixed with the first object 15. Each switch unit 30 (FIGS. 4A and 4B) comprises an enclosure 40 that has a top side 48, a bottom side 42, a front edge 41, and a rear edge 49. The front edge 41 includes two front connectors 50, and the rear edge 49 includes two rear connectors 60. The rear connectors 60 are adapted for receiving the front connectors 50 of an adjacent switch unit 30 only when the adjacent switch unit 30 is inverted (FIG. 8). Each enclosure 40 has an interior space 45 between the top side 48 and the bottom side 42.

The interior space 45 contains an electric circuit 70 therein that includes at least a switch 80, a resistor 90, and conductors 100 arranged to convey electricity from one of the front connectors 50 to one of the rear connectors 60, and from the other front connector 50 to the other rear connector 60 via either the resistor 90 or the switch 80 when the switch 80 is closed. The switch 80 is normally open but closed when proximate a sufficiently strong magnetic field. The enclosure 40 is preferably made with a non-conductive polymer material.

Preferably the enclosure 40 of each switch unit 30 includes two identical shells 43 that may be mutually fastened around the electric circuit 70 and either ultrasonically or adhesively bonded together to form the enclosure 40, or provided with a plurality of mutual mechanical snap fasteners for fictionally retaining each shell 43 together.

Figure 5A:
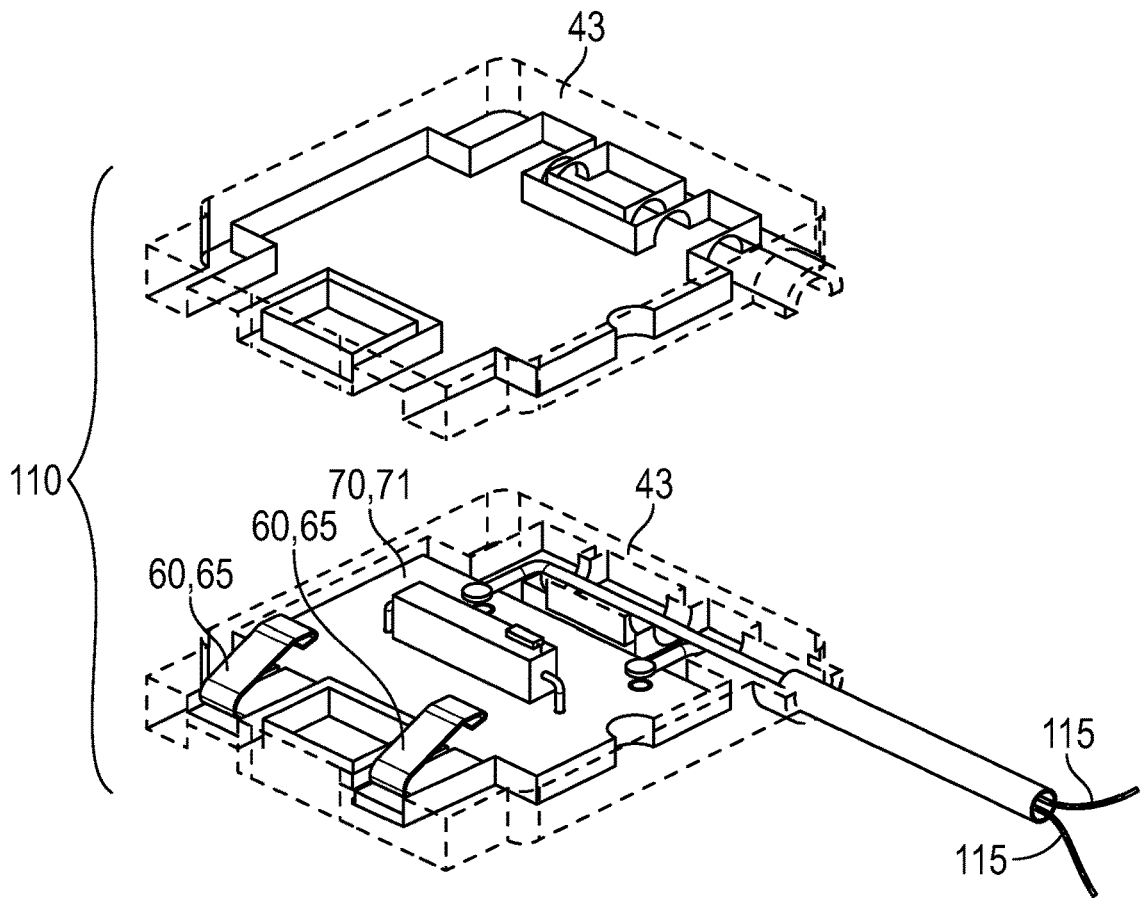
FIG. 5A is an exploded perspective view of one of the switch units designated as a first switch unit.
Figure 5B:
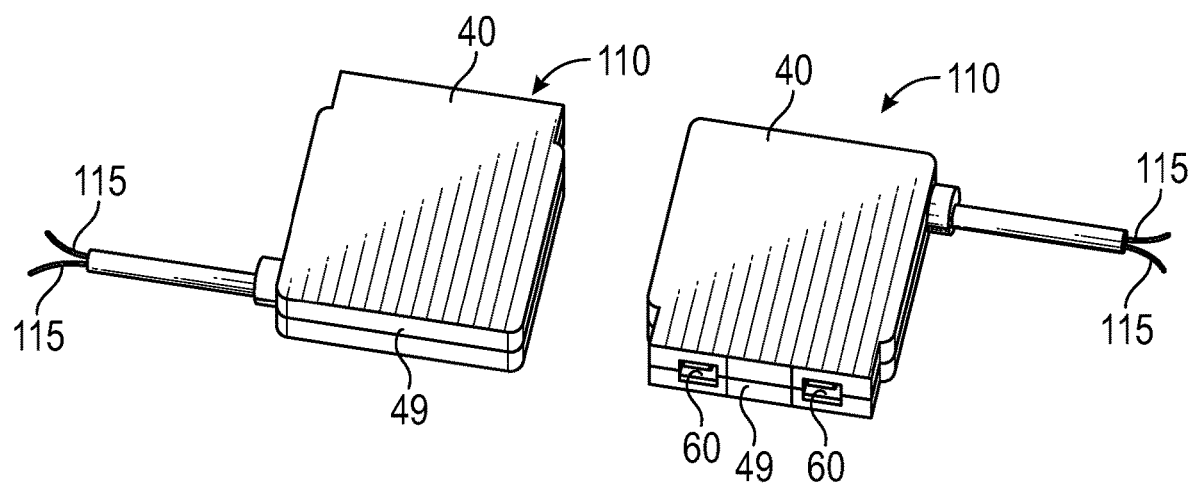
FIG. 5B is a perspective view of a pair of the first switch units, showing a front side and a rear side thereof.
Figure 5C:
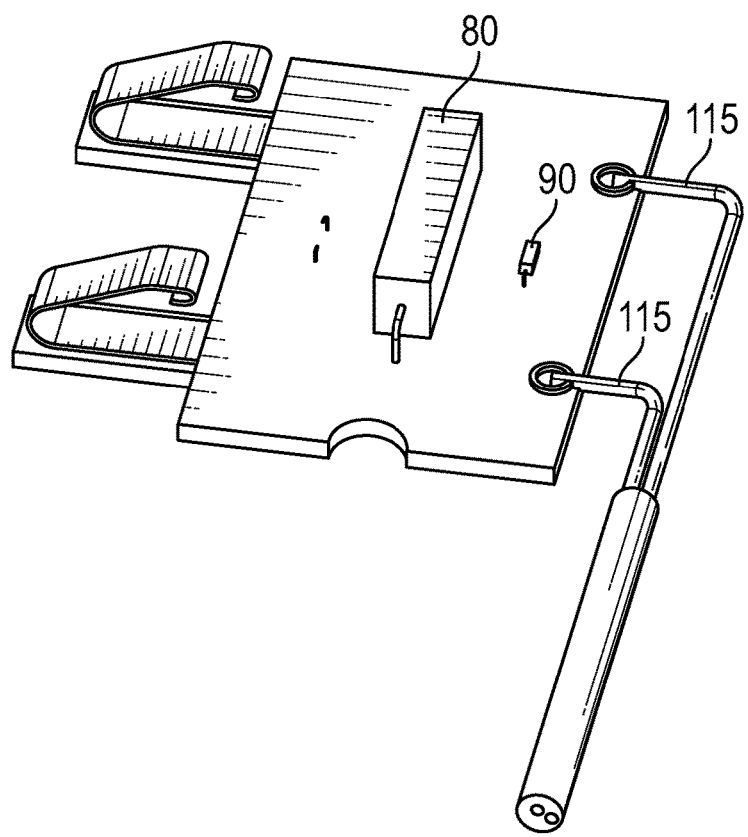
FIG. 5C is a perspective view of an electric circuit and circuit board of the first switch unit.

A designated first switch unit 110 (FIGS. 5A-5C) is identical to the switch unit 30 except that the front edge 41 terminates with a pair of conductive wires 115, does not include the front connectors 50, and is therefore not adapted for insertion into the rear connectors 60 of another switch unit 30. The first switch unit 110 is positioned at a proximal end 22 of the array 20 of switch units 30.

Figure 7A:
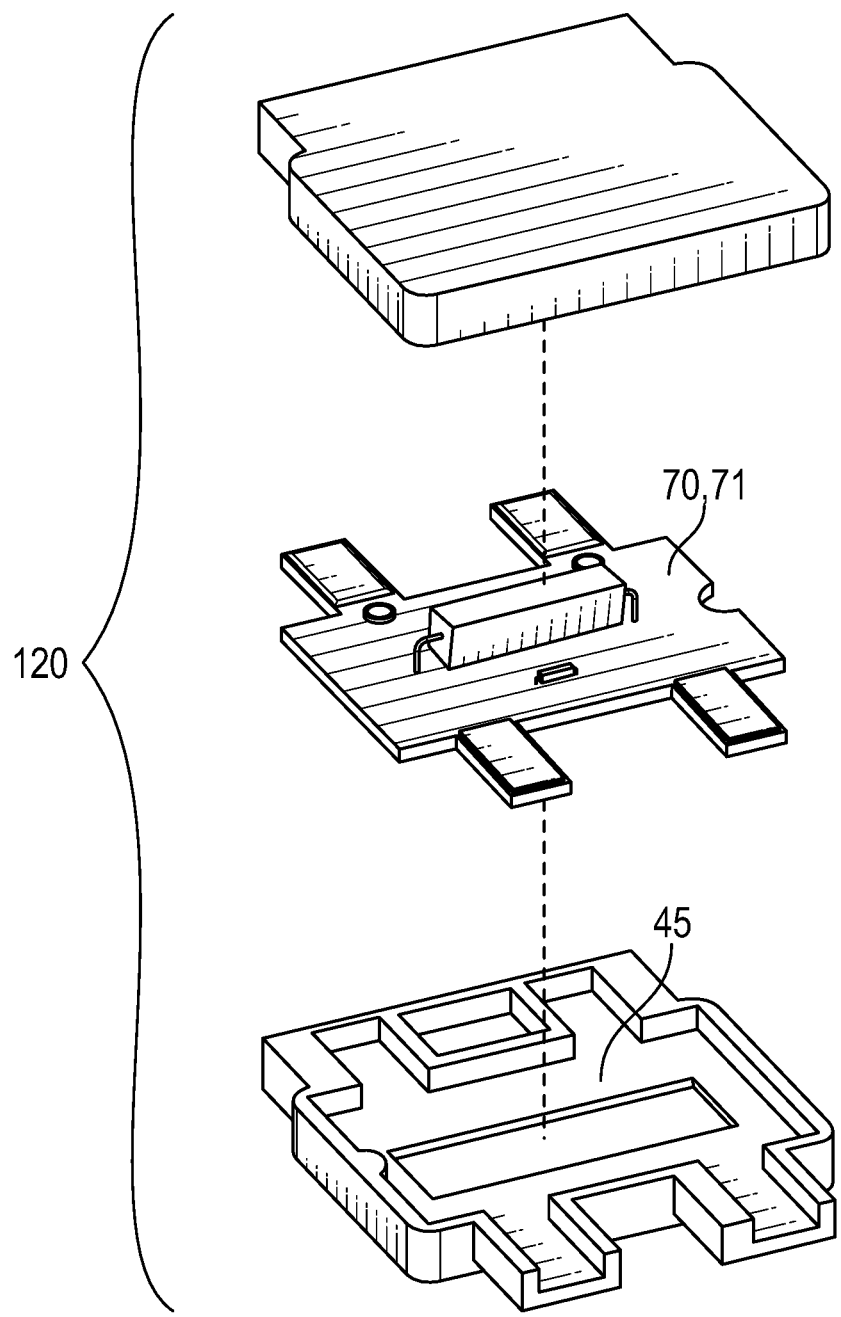
FIG. 7A is an exploded perspective view of one of the switch units designated as a last switch unit.
Figure 7B:
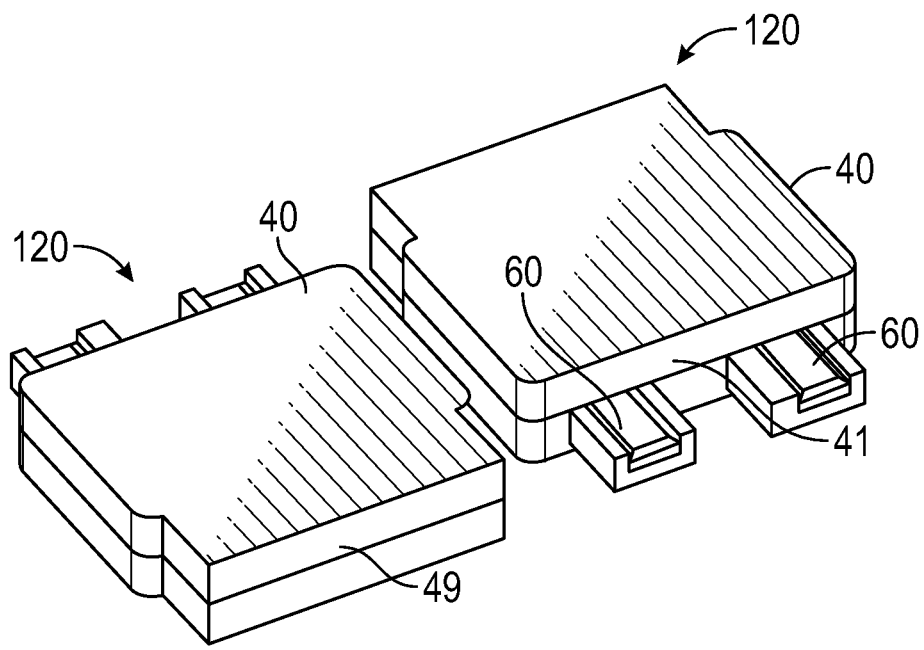
FIG. 7B is a perspective view of a pair of the last switch units, showing a front side and a rear side thereof.
Figure 7C:
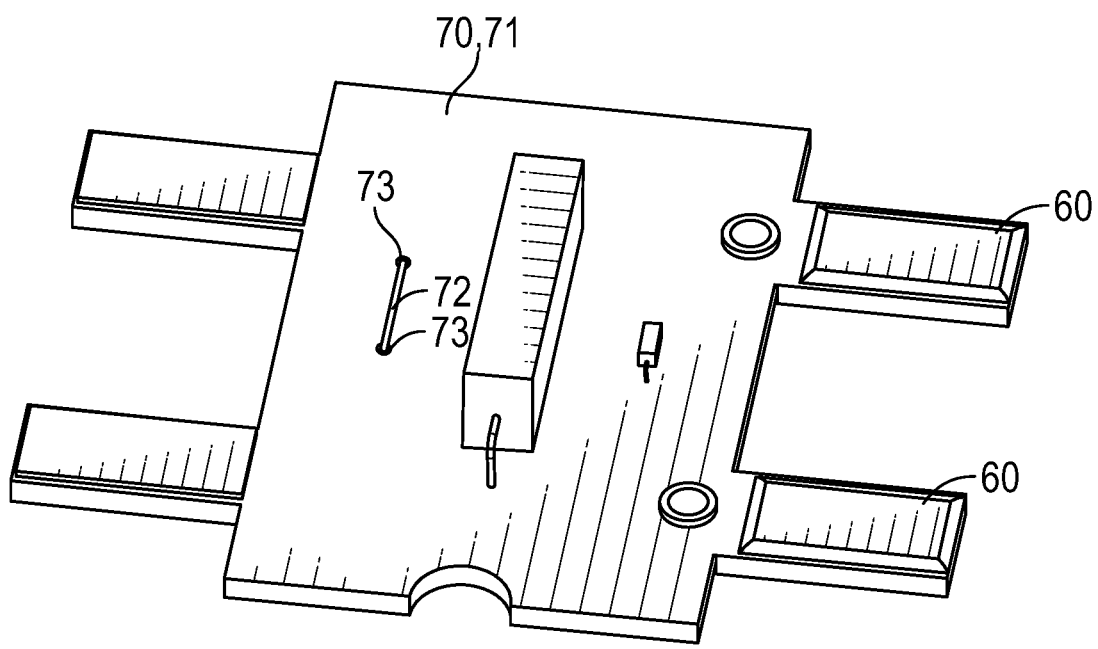
FIG. 7C is a perspective view of an electric circuit and circuit board of the last switch unit.

A designated last switch unit 120 (FIGS. 7A-7C) is identical to the switch unit 30 except that the rear edge 49 does not include the rear connectors 60 and is therefore not adapted for receiving the front connectors 50 of another switch unit 30. The last switch unit 120 is positioned at a distal end 28 of the array 20 of switch units 30. Within the last switch unit 120 the front connectors 50 are electrically mutually connected.

An array 21 of magnet units 130 (FIGS. 6A and 6B) is fixed with the second object 16 proximate the array 20 of switch units 30. Each magnet unit 130 includes an enclosure 140 having a top side 148, a bottom side 142, a front edge 141, and a rear edge 149. The front edge 141 includes a first part 151 of a two-part mechanical connector 150, and the rear edge 149 includes a cooperative second part 152 of the two-part mechanical connector 150. As such, two adjacent magnet units 130 may be mechanically coupled, each magnet unit 130 having an interior space 145 between the top side 148 and the bottom side 142 containing a magnet 135 therein. The enclosure 140 of each magnet unit 130 may include a top portion 146 and a bottom portion 144 (FIG. 6A) mutually fastened with ultrasonic bonding, adhesive bonding, mechanical snap fasteners (not shown), or the like.

Figure 10:
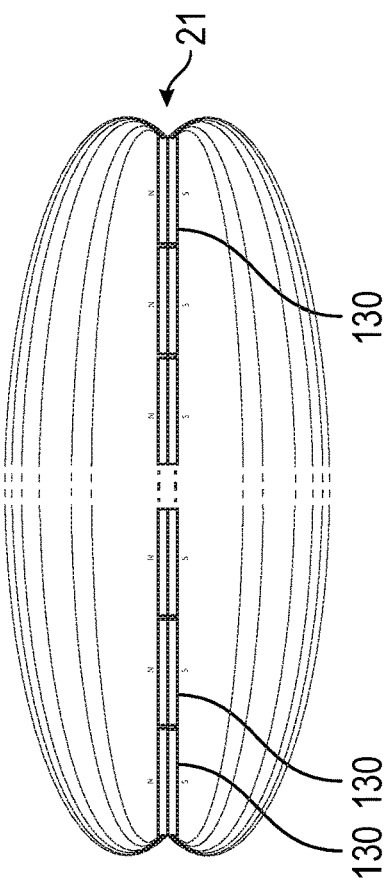
FIG. 10 is a diagram of the magnetic force field lines generated by the magnet array.

Preferably the first part 151 of the two-part mechanical connector 150 includes at least one tab 153, and the second part 152 of the two-part mechanical connector 150 includes at least one cooperative slot 154, such that the magnet units 130 are mechanically coupled by pressing the at least one tab 153 into one of the at least one cooperative slots 154. Contrasting with the switch units 30, preferably the two-part mechanical connector 150 of the magnet units 130 are indexed or keyed so that adjacent magnet units 130 must be mutually similarly oriented in order to be inserted into the next magnet unit 130 and to maintain coplanar top sides 148 and bottom sides 142 in the array 21 of magnet units 130. This also ensures that the magnetic fields produced by the magnet units 130 (FIG. 10) are never inverted along the array 21 at any of the magnet unit 130. Further, the at least one tab 153 of each enclosure 140 of each magnet unit 130 is sized or keyed to prevent its inadvertent insertion into any of the switch units 30.

In use, in a first configuration 160 of the two objects 15,16, the switch 80 of each switch unit 30 is in proximity to the magnetic field generated by the magnet 135 of one of the magnet units 130, with each switch 80 closed and the resistance between the pair of conductive wires 115 of the first switch unit 110 being a minimum resistance $R_{min}$.

In a second configuration 170 of the two objects 15,16, a minimum number of the switches 80 of each switch unit 30 are in proximity to the magnetic field generated by the magnets 135 of the magnet units 130, resulting in a maximum resistance $R_{max}$ between the pair of conductive wires 155 of the first switch unit 110. Relative positions of the two objects 15,16 between the first configuration 160 and the second configuration 170 result in an associated resistance between the minimum resistance $R_{min}$ and the maximum resistance $R_{max}$.

For example, FIG. 1 shows a switch array 20 having one of the first switch units 110, six of the regular switch units 30, and one of the last switch units 120, for a total of eight switches 80 and eight resistors 90. The switch array 20 is aligned substantially parallel to and proximate to an array 21 having eight of the magnet units 130. As such, the magnetic field generated by the magnets 135 in each of the magnet units 130 is sufficient to close the normally-open switches 80, such that the switch array 20 provides a cumulative resistance between the conductive wires 115 of substantially zero ohms.

As the second object 16 moves away from the first object 15 (FIG. 2), the switches 80 in each of the switch units 30 begin to open as the strength of the magnetic field near the switches 80 subsides, resulting in increasing resistance between the conductive wires 115 of the first switch unit 110. In the example of FIG. 2, six of the switches 80 in the switch units 110,30 have opened. If each resistor 90 is, for example, ten ohms, then with six open switches 80 the resulting resistance between the conductive wires 115 of the first switch unit 110 will be approximately 60 ohms. When the objects 15,16 are sufficiently mutually separated in the second configuration 170 (FIG. 3), all of the switches 80 are open and the resulting resistance between the conductive wires 115 of the first switch unit 110 will be approximately 80 ohms. As such, an array of 10,000 switch units 30 could in theory be utilized without loss in resolution.

Preferably the top sides 48 of each switch unit 30, the first switch unit 110 and the last switch unit 120 are all substantially coplanar when mutually connected. Similarly, the bottom sides 42 of each switch unit 30, the first switch unit 110 and the last switch unit 120 are all substantially coplanar when mutually connected. In some embodiments, each enclosure 40 includes a first lateral side 44 and a second lateral side 46. The first lateral sides 44 of each switch unit 30 are substantially co-planar when mutually connected, and similarly the second lateral sides 46 of each switch unit 30 are substantially co-planar when mutually connected.

The electric circuit 70 of each switch unit 30 includes a circuit board 71, and preferably the last switch unit 120 includes an identical circuit board 71 but further includes a conductive jumper 72 electrically connected between two conductive shunt pads 73. In such an embodiment, one of the shunt pads 73 is connected with the one front connector 50 and the other shunt pad 73 is connected to the other front connector 50 through either the resistor 90 or the switch 80 when the switch 80 is closed.

Preferably each rear connector 60 of each switch unit 30, designated first switch unit 110, and designated last switch unit 120 includes a conductive spring contact 65. In such embodiments, the front connector 50 of each switch unit 30 and the designated last switch unit 120 includes a conductive pad 55, such that when one of the front connectors 50 is inserted into one of the rear connectors 60, the spring contact 65 of the rear connector 60 presses against the conductive pad 55 of the front connector 50 to make electrical contact. As such, the switch units 30 can be identical without the need for multiple circuit board styles and enclosures 40, the connectors 50,60 being keyed to only accept insertion of an adjacent switch unit 30 if the adjacent switch unit 30 is inverted.

This saves on tooling costs since only one configuration of enclosure 40 is required, and only one type of circuit board 71 is required.

Figure 6A:
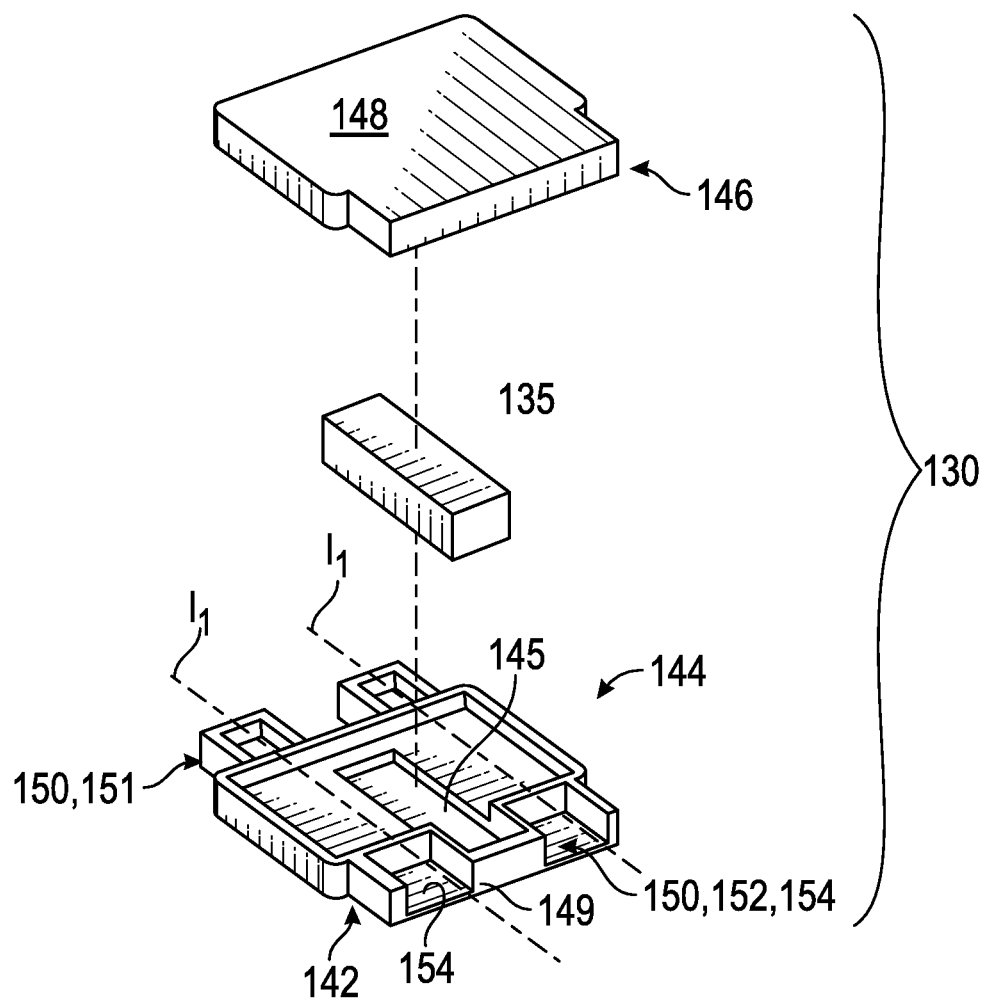
FIG. 6A is an exploded perspective view of a magnet unit of the invention.
Figure 6B:
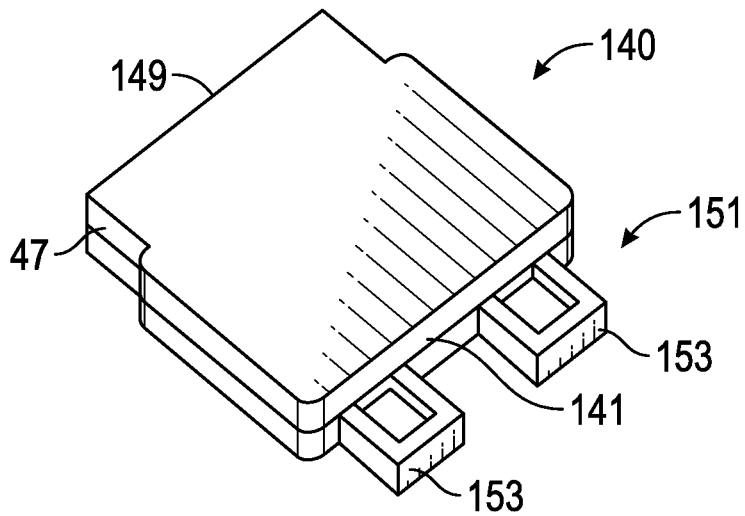
FIG. 6B is a perspective view of the magnet unit.
Figure 9:
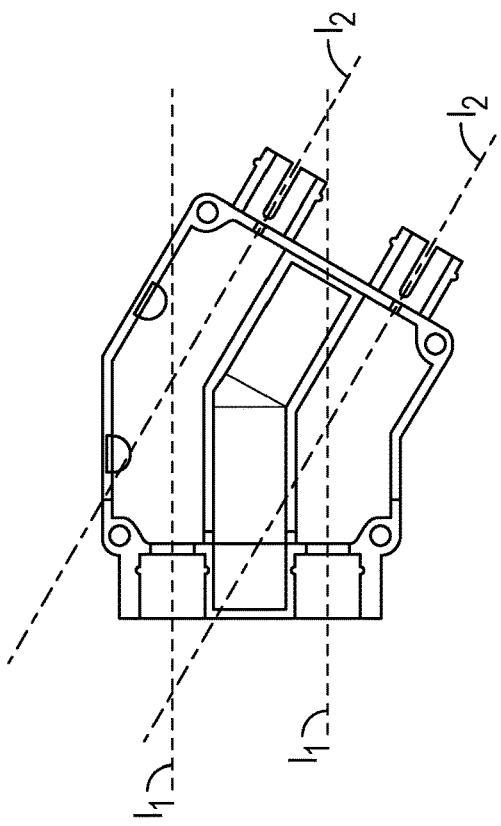
FIG. 9 is an alternate embodiment of the switch unit having an angled enclosure.

Preferably the front connectors 50 and rear connectors 60 of each switch unit 30 are aligned along parallel axes $L_1$ (FIG. 6A). Alternately, the front connectors 50 of each switch unit 30 are aligned along axes $L_1$, while the rear connectors 60 of each switch unit 30 are aligned along axes $L_2$, with $L_1$ not being parallel to $L_2$ (FIG. 9), such that the array 20 of switch units 30 form an arc. In such an embodiment, the two-part mechanical connectors 150 of each magnet unit 140 are similarly non-parallel.

While a particular form of the invention has been illustrated and described, it will be apparent that various modifications can be made without departing from the spirit and scope of the invention. For example, each switch unit could include one of the male connectors 50 and one of the female connectors 60 on both the front edge 41 and the rear edge 49 of each enclosure 40. The configuration of the female connectors 60 compared with that of the male connectors 50 can be altered from that shown in the figures. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A modular sensing system for determining the relative lineal position between a first object and a second object, comprising:

an array of switch units, each switch unit comprising an enclosure having a top side, a bottom side, a front edge, and a rear edge, the front edge including two front connectors and the rear edge including two rear connectors, the rear connectors adapted for receiving the front connectors of an adjacent switch unit only when the adjacent switch unit is inverted, each enclosure having an interior space between the top side and the bottom side having an electric circuit therein that includes at least a switch, a resistor, and conductors arranged to convey electricity from one of the front connectors to one of the rear connectors, and from the other front connector to the other rear connector via either the resistor or the switch when the switch is closed, the switch being normally open but closed when proximate a sufficiently strong magnetic field;

a designated first switch unit identical to the switch unit except that the front edge terminates with a pair of conductive wires, does not include the front connectors, and is therefore not adapted for insertion into the rear connectors of another switch unit, the first switch unit positioned at a proximal end of the array of switch units;

a designated last switch unit identical to the switch unit except that the rear edge does not include the rear connectors and is therefore not adapted for receiving the front connectors of another switch unit, the last switch unit positioned at a distal end of the array of switch units and wherein one of the front connectors is electrically connected to the other front connector via either the resistor or the switch when the switch is closed; and an array of magnet units, each magnet unit comprising an enclosure having a top side, a bottom side, a front edge, and a rear edge, the front edge including a first part of a two-part mechanical connector, and the rear edge including a cooperative second part of the two-part mechanical connector, whereby two adjacent magnet units may be mechanically coupled, each magnet unit having an interior space between the top side and the bottom side having a magnet therein;

the first switch unit, the array of switch units, and the last switch units fixed with the first object and the array of magnet units fixed with the second object, such that in a first configuration of the two objects the switch of each switch unit is in proximity to the magnetic field generated by the magnet of one of the magnet units, each switch being closed and the resistance between the pair of conductive wires of the first switch unit being a minimum resistance, and such that in a second configuration of the two objects a minimum number of the switches of each switch unit are in proximity to the magnetic field generated by the magnets of the magnet units, resulting in a maximum resistance between the pair of conductive wires of the first switch, relative positions of the two objects between the first configuration and the second configuration resulting in an associated resistance between the minimum and maximum resistances.

2. The modular sensing system of claim 1 wherein the top sides of each switch unit, the designated first switch unit, and the designated last switch unit are all substantially co-planar when mutually connected, and wherein the bottom sides of each switch unit, the designated first switch unit, and the designated last switch unit are all substantially co-planar when mutually connected.

3. The modular sensing system of claim 1 wherein the enclosure of each switch unit, the designated first switch unit, and the designated last switch unit each have a first lateral side and a second lateral side, the first lateral side of each switch unit being substantially co-planar when mutually connected, and the second lateral side of each switch unit being substantially co-planar when mutually connected.

4. The modular sensing system of claim 1 wherein each rear connector of each switch unit and the designated first switch unit both include a conductive spring contact, and wherein the front connector of each switch unit and the designated last switch unit both include a conductive pad, whereby when one of the front connectors is inserted into one of the rear connectors the spring contact of the rear connector presses against the conductive pad of the front connector to make electrical contact.

5. The modular sensing system of claim 1 wherein the electric circuit includes a circuit board, and wherein the circuit board of the last switch unit is identical to the circuit board of each switch unit but further includes a conductive jumper electrically connected between two conductive shunt pads, one shunt pad connected with the one front connectors and the other shunt pad connected to the other front connector through either the resistor or the switch when the switch is closed.

6. The modular sensing system of claim 1 wherein the first part of the two-part mechanical connector of each magnet unit includes at least one tab, and wherein the second part of the two-part mechanical connector includes at least one cooperative slot, whereby the magnet units are mechanically coupled by pressing the at least one tab into one of the at least one cooperative slots.

7. The modular sensing system of claim 1 wherein each resistor has a value of substantially 10 ohms, whereby the number of switch units in the array can be from 1 to 10,000 units.

8. The modular sensing system of claim 1 wherein the top sides of each magnet unit are substantially co-planar when mutually connected, and wherein the bottom sides of each magnet unit are substantially co-planar when mutually connected.

9. The modular sensing system of claim 1 wherein the enclosure of each switch unit is made with a non-conductive polymer material.

10. The modular sensing system of claim 9 wherein the enclosure of each switch unit includes two identical shells that may be mutually fastened around the electric circuit.

11. The modular sensing system of claim 10 wherein the two shells are ultrasonically bonded together to form the enclosure.

12. The modular sensing system of claim 10 wherein the two shells are adhesively bonded together to form the enclosure.

13. The modular sensing system of claim 1 wherein the enclosure of each magnet unit includes a top portion and a bottom portion that may be mutually fastened around the magnet.

14. The modular sensing system of claim 1 wherein the front connectors and rear connectors of each switch unit are aligned along parallel axes.

15. The modular sensing system of claim 1 wherein the front connectors and rear connectors of each switch unit are not aligned along parallel axes, such that the array of switches forms an arc, and wherein the two-part mechanical connectors of each magnet unit are similarly non-parallel.

* * * * *